US012813187B2

(12) United States Patent
Hou et al.

(10) Patent No.: US 12,813,187 B2
(45) Date of Patent: Nov. 24, 2026

(54) APPARATUS FOR ELECTRO-CHEMICAL PLATING

(71) Applicant: TAIWAN SEMICONDUCTOR MANUFACTURING COMPANY, LTD., Hsinchu (TW)

(72) Inventors: Kuo-Lung Hou, Taichung City (TW); Ming-Hsien Lin, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 229 days.

(21) Appl. No.: 18/231,196

(22) Filed: Aug. 7, 2023

(65) Prior Publication Data

US 2023/0386824 A1 Nov. 30, 2023

Related U.S. Application Data

(62) Division of application No. 17/232,937, filed on Apr. 16, 2021, now Pat. No. 12,020,922.

(51) Int. Cl.
*H01L 21/02* (2006.01)
*B08B 3/02* (2006.01)
(Continued)

(52) U.S. Cl.
CPC ................ *H10P 70/54* (2026.01); *B08B 3/02* (2013.01); *B08B 3/08* (2013.01); *B08B 13/00* (2013.01);
(Continued)

(58) Field of Classification Search
CPC ........... H01L 21/02087; H01L 21/2885; H01L 21/67051; H01L 21/67253; H01L 22/26;
(Continued)

(56) References Cited

U.S. PATENT DOCUMENTS 5,939,139 A * 8/1999 Fujimoto ................ G03F 7/168 431/231
6,516,815 B1 * 2/2003 Stevens ............... H10P 72/0424 134/147

(Continued)

FOREIGN PATENT DOCUMENTS

KR 20150064495 A 10/1999
KR 20140058335 * 5/2014
KR 20150064495 * 6/2015

OTHER PUBLICATIONS

Non-Final Office Action issued in U.S. Appl. No. 17/232,937, dated Apr. 27, 2023.

*Primary Examiner* — Alexander Markoff

(74) *Attorney, Agent, or Firm* — STUDEBAKER BRACKETT PLLC

(57) ABSTRACT

An electrochemical plating apparatus for performing an edge bevel removal process on a wafer includes a cell chamber. The cell chamber includes two or more nozzles located adjacent to the edge of the wafer. A flow regulator is arranged with each of the two or more nozzles, which is configured to regulate a tap width of a deposited film flowing out through the each of the two or more nozzles. The electrochemical plating apparatus further includes a controller to control the flow regulator such that tap width of the deposited film includes a pre-determined surface profile. The two or more nozzles are located in radially or angularly different dispensing positions above the wafer.

20 Claims, 13 Drawing Sheets

(51) Int. Cl.

| | |
|---|---|
| ***B08B 3/08*** | (2006.01) |
| ***B08B 13/00*** | (2006.01) |
| ***C25D 5/54*** | (2006.01) |
| ***C25D 7/12*** | (2006.01) |
| ***C25D 21/12*** | (2006.01) |
| ***H10P 14/47*** | (2026.01) |
| ***H10P 70/00*** | (2026.01) |
| ***H10P 72/00*** | (2026.01) |
| ***H10P 74/00*** | (2026.01) |

(52) U.S. Cl.
CPC ................. *C25D 5/54* (2013.01); *C25D 7/12* (2013.01); *C25D 21/12* (2013.01); *H10P 14/47* (2026.01); *H10P 72/0414* (2026.01); *H10P 72/0604* (2026.01); *H10P 74/238* (2026.01)

(58) Field of Classification Search
CPC ....... H01L 21/76838; H01L 2221/1068; B08B 3/02; B08B 3/08; B08B 13/00; C25D 5/54; C25D 7/12; C25D 21/12; C25D 17/001; C25D 17/02; C25D 21/18; C25D 5/00; C23F 1/02; C23F 1/18; H10P 70/54; H10P 14/47; H10P 72/0414; H10P 72/0604; H10P 74/238; H10W 20/031
See application file for complete search history.

(56) References Cited

U.S. PATENT DOCUMENTS

| | | | | |
|---|---|---|---|---|
| 6,669,809 | B2 * | 12/2003 | Hashimoto | H10P 72/0424 134/113 |
| 6,691,719 | B2 * | 2/2004 | Ko | H10P 72/0414 134/198 |
| 6,983,755 | B2 * | 1/2006 | Nam | H10P 72/0414 134/154 |
| 11,660,643 | B2 * | 5/2023 | Ishibashi | B08B 3/02 134/198 |
| 2001/0037858 | A1 * | 11/2001 | Taniyama | H10P 72/0424 156/345.21 |
| 2006/0112979 | A1 * | 6/2006 | Kim | H10P 72/0424 134/198 |
| 2006/0272676 | A1 * | 12/2006 | Iwase | H10P 70/54 134/33 |
| 2007/0093067 | A1 | 4/2007 | Chang et al. | |
| 2008/0060683 | A1 * | 3/2008 | Arvidson | H10P 72/0414 134/2 |
| 2010/0055924 | A1 | 3/2010 | Ganesan et al. | |
| 2014/0038423 | A1 * | 2/2014 | Iwao | H10P 14/00 438/758 |
| 2014/0144463 | A1 * | 5/2014 | Brown | H10P 50/287 134/1.3 |
| 2015/0136183 | A1 * | 5/2015 | Brown | H10P 72/0414 134/95.3 |
| 2018/0211832 | A1 * | 7/2018 | Hasimoto | H10P 70/54 |
| 2021/0257210 | A1 * | 8/2021 | Tokunaga | H10P 70/54 |

* cited by examiner

APPARATUS FOR ELECTRO-CHEMICAL PLATING

RELATED APPLICATION

This application is a divisional application of U.S. patent application Ser. No. 17/232,937 filed Apr. 16, 2021, now U.S. Pat. No. 12,020,922, entitled "Apparatus For Electro-Chemical Plating," the entire content of which is incorporated herein by reference.

BACKGROUND

Electrochemical plating (ECP) is a common manufacturing process that applies a thin layer of one metal onto another. Electrochemical plating is widely performed in the electronics industry to deposit electrically conductive metals used in printed circuit boards, connectors, and semiconductor interconnects.

Electroplating cells (e.g., vessels) are used in the ECP processes to provide a plating solution where metal electrolytes deposit onto the wafer. In wafer electroplating processing, the quality and uniformity of the deposited metal layer on the wafer is a major concern. In the ECP processes, a uniform, defect-free metal film is desired, because defects on the deposited metal film such as pits, protrusions, or particles reduce wafer performance and frequently yield.

There is a need for an improved process that allows the wafer contacting the plating solution at a plating surface in a horizontally parallel manner to maintain a uniform reliability of the electrochemical plating so that defect-free plating occurs. Achieving a uniform deposition quality without any bubbles and/or by-products from the processing solution during the electrochemical plating is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or pre-determined properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The manufacture of semiconductor devices often requires formation of electrical conductors on semiconductor wafers. For example, electrically conductive leads on the wafer are often formed by electrochemical plating (depositing) an electrically conductive material, such as copper, on the wafer and patterned into desired shapes. Electrochemical plating involves making electrical contact with the wafer surface upon which the electrically conductive layer is to be deposited. A current is then passed through a plating solution (i.e. a solution containing ions of the element being deposited, for example a solution containing $Cu^{2+}$) between an anode and the wafer plating surface, with the wafer plating surface acting as a cathode. This causes an electrochemical reaction on the wafer plating surface resulting in the deposition of the electrically conductive layer.

Figure 1:
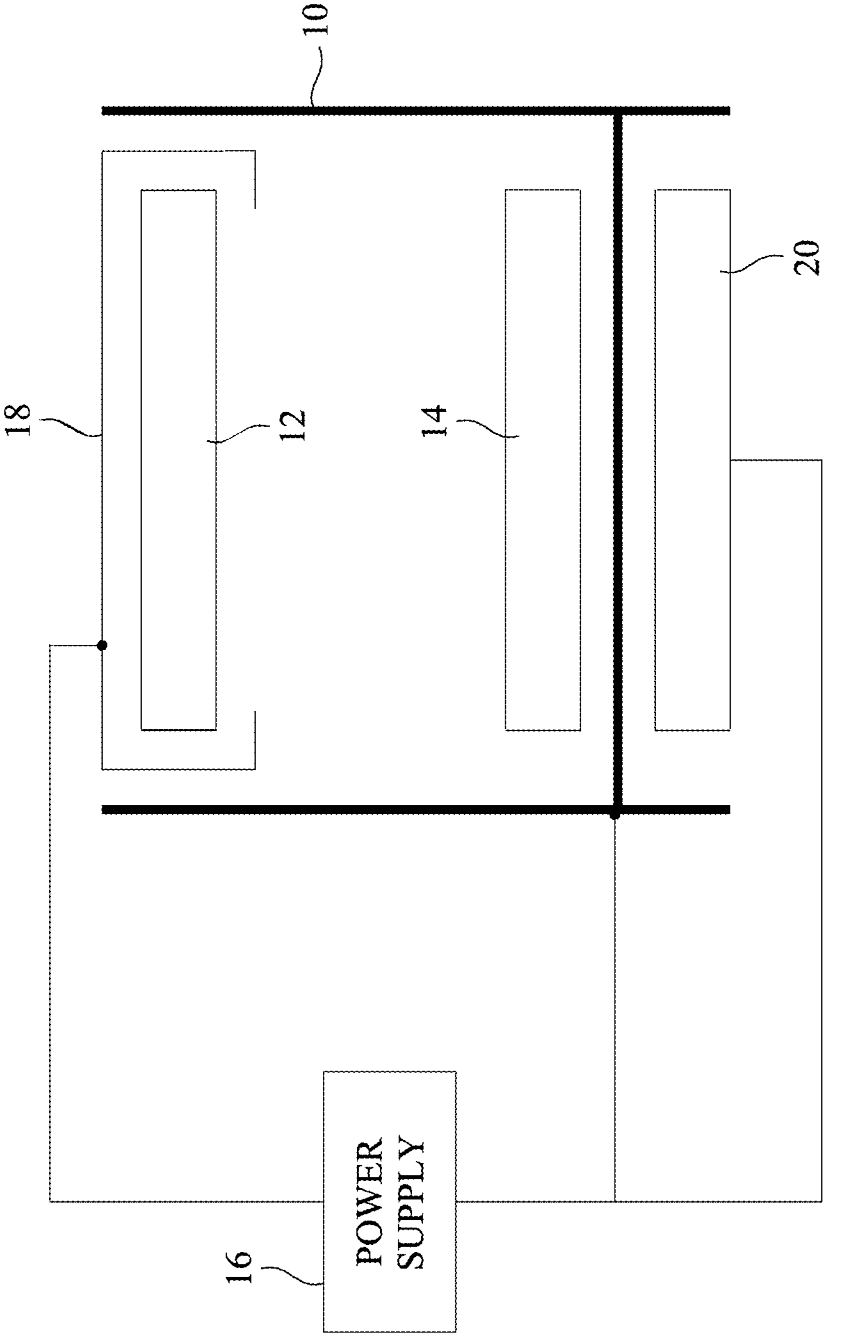
FIG. 1 is a schematic view of an electrochemical plating system.

FIG. 1 is a schematic view of an electrochemical plating system. The electrochemical plating system includes a process vessel or tank 10 that holds a suitable plating solution or liquid. The wafer 12 acts as a cathode onto which material derived from an anode 14 is deposited (e.g., Cu), which is disposed within the process vessel or tank 10. In some embodiments, a third electrode 20 is disposed beneath the vessel 10 but in proximity to the plating bath. A power supply 16 is coupled to an open circuit with electrode 20 and a fixture 18 so as to apply a static electric charge to the wafer 12. In some cases, the fixture 18 is configured to hold and rotate the wafer 12.

Figure 2A:
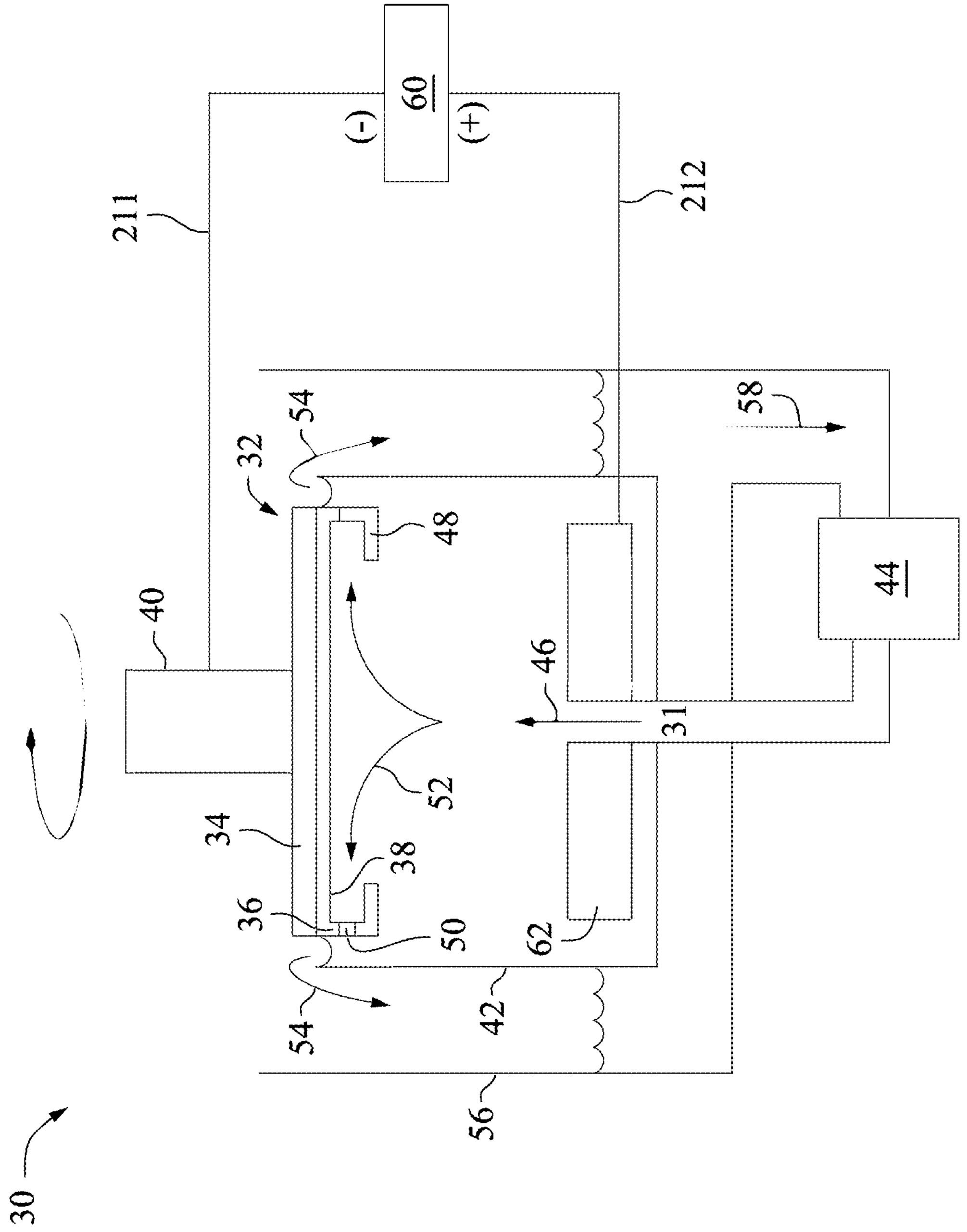
FIG. 2A is a schematic view of an electrochemical plating apparatus including a substrate according to some embodiments of the disclosure.

FIG. 2A is a schematic view of an electrochemical plating apparatus 30 including a substrate 38 according to some embodiments of the disclosure. The electrochemical plating apparatus 30 includes a substrate holder 32 mounted on a rotatable spindle 40 which allows rotation of the substrate holder 32. The substrate holder 32 includes a cone 34, a cup 36, a flange 48, and apertures 50. Before the electrochemical plating process starts, the substrate 38 is mounted in the cup 36. The substrate holder 32 and the substrate 38 are then placed into an electroplating cell 42 that serves as a container/vessel for containing a plating solution 31, e.g., a copper sulfate ($CuSO_4$) solution. As indicated by arrow 46, the plating solution 31 is continually provided to the electroplating cell 42 by a pump 44. The plating solution 31 flows upwards towards the substrate 38, then radially outward and across the substrate 38, and then flows through the apertures 50 as indicated by arrows 52. By directing the plating solution 31 towards the substrate 38 (e.g., towards the center of the substrate 38), any gas bubbles entrapped on the substrate 38 are removed through the apertures 50. In some embodiments, the plating solution 31 overflows from the electroplating cell 42 to an overflow reservoir 56 as indicated by arrows 54. The plating solution 31 is then filtered and returned to pump 44 as indicated by arrow 58 completing a recirculation of the plating solution 31.

The plating solution 31 may include a mixture of copper salt, acid, water and various organic and inorganic additives that improve the properties of the deposited copper. Suitable copper salts for the plating solution 31 include copper sulfate, copper cyanide, copper sulfamate, copper chloride, copper formate, copper fluoride, copper nitrate, copper oxide, copper fluorine-borate, copper trifluoroacetate, copper pyrophosphate and copper methane sulfonate, or hydrates of any of the foregoing compounds. The concentration of the copper salt used in the plating solution will vary depending on the particular copper salt used.

Various acids can be used in the plating solution 31, including: sulfuric acid, methanesulfonic acid, fluoroboric acid, hydrochloric acid, hydroiodic acid, nitric acid, phosphoric acid and other suitable acids. The concentration of the acid used will vary depending on the particular acid used in the plating solution 31.

Additives for the copper plating solution 31 include brighteners, suppressors and levelers. Brighteners are organic molecules that improve the specularity (or reflectivity) of the copper deposit by reducing both surface roughness and grain-size variation. Suitable brighteners include, for example, organic sulfide compounds, such as bis-(sodium sulfopropyl)-disulfide, 3-mercapto-1-propanesulfonic acid sodium salt, N-dimethyl-dithiocarbamyl propylsulfonic acid sodium salt and 3-S-isothiuronium propyl sulfonate, or mixtures of any of the foregoing compounds. Suppressors are macromolecule deposition inhibitors that adsorb over the surface of the substrate and reduce local deposition rates, thereby increasing the deposition uniformity. Levelers include ingredients with nitrogen functional groups and may be added to the plating solution at a relatively low concentration. Leveling involves the diffusion or migration of strongly current suppressing species to corners or edges of macroscopic objects which otherwise plate more rapidly than desired due to electric field and solution mass transfer effects. The levelers may be selected from the following agents: a polyether surfactant, a nonionic surfactant, a cationic surfactant, an anionic surfactant, a block copolymer surfactant, a polyethylene glycol surfactant, polyacrylic acid, a polyamine, aminocarboxylic acid, hydrocarboxylic acid, citric acid, entprol, edetic acid, tartaric acid, a quaternized polyamine, a polyacrylamide, a cross-linked polyamide, a phenazine azo-dye, an alkoxylated amine surfactant, polymer pyridine derivatives, polyethyleneimine, polyethyleneimine ethanol, a polymer of imidazoline and epichlorohydrine, and benzylated polyamine polymer.

The substrate 38 and an anode 62 are both immersed in the plating solution 31 (e.g., $CuSO_4$ solution) containing one or more dissolved metal salts as well as other ions that permit the flow of electricity. The substrate 38 acts as a cathode onto which material from the anode 62 is deposited. A DC power supply 60 has a negative output lead 211 electrically connected to the substrate 38 through one or more slip rings, brushes and contacts (not shown). The positive output lead 212 of the power supply 60 is electrically connected to the anode 62. During use, the power supply 60 biases the substrate 38 to have a negative potential relative to the anode 62 causing an electrical current to flow from the anode 62 to the substrate 38. As used herein, electrical current flows in the same direction as the net positive ion flux and opposite the net electron flux. This causes an electrochemical reaction (e.g., $Cu^{2+}+2e^{-}=Cu$) on the substrate 38 which results in the deposition of the electrically conductive layer (e.g. copper) on the substrate 38. The ion concentration of the plating solution is replenished during the plating cycle by dissolving the anode 62 which is made of a metallic compound (e.g., $Cu=Cu^{2+}+2e^{-}$).

Figure 2B:
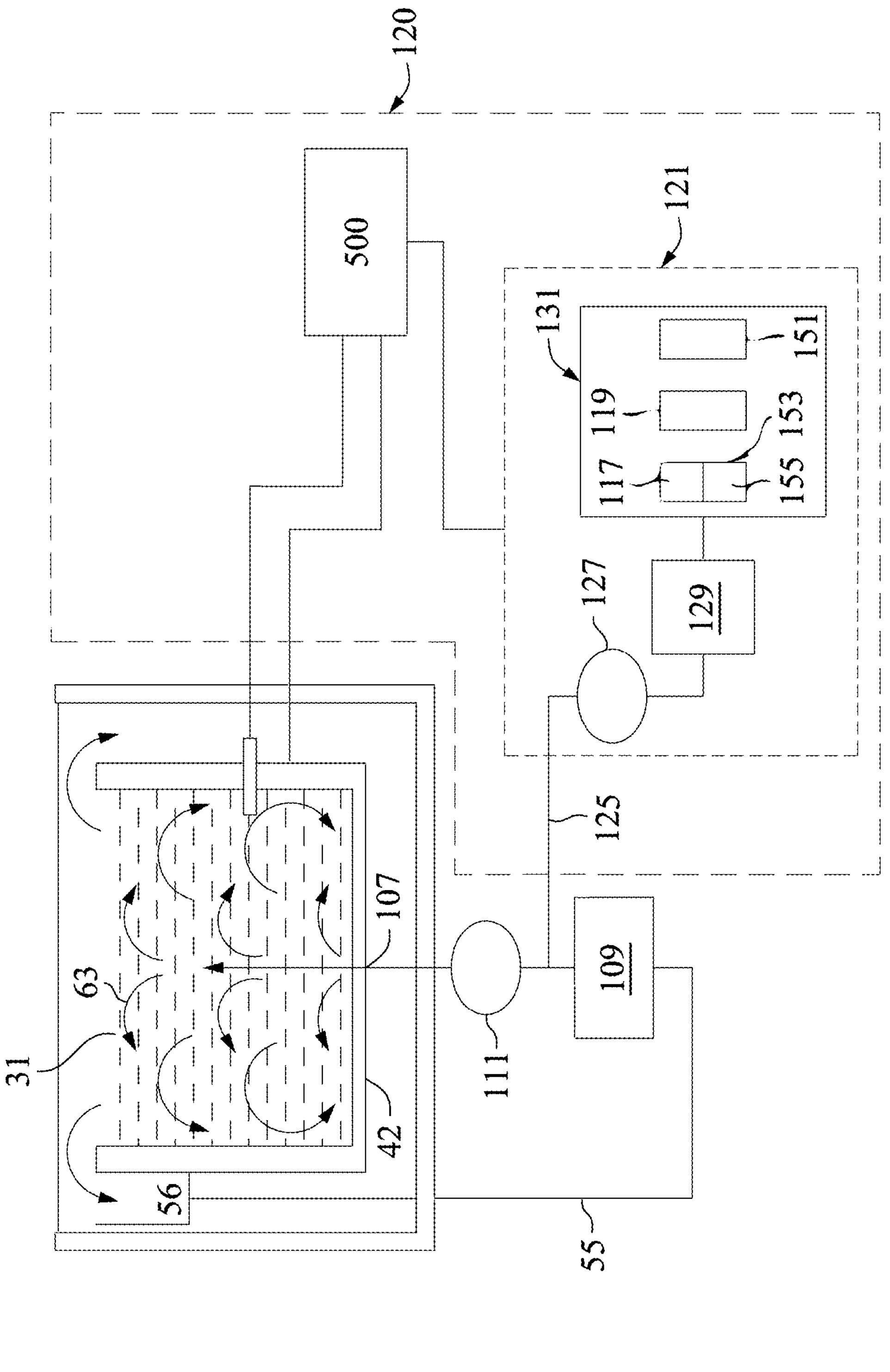
FIG. 2B is a schematic view of a processing system including the electrochemical plating apparatus of FIG. 2A.

FIG. 2B is a schematic view of a processing system 400 that is used with the electrochemical plating apparatus 30 in FIG. 2A to bring the substrate 38 into contact with the plating solution 31 in some embodiments. Referring to FIG. 2B, with continued reference to FIG. 2A, the electroplating cell 42 holds the plating solution 31, and the substrate 38 is immersed into the plating solution 31. As such, the electroplating cell 42 is sized based at least in part upon the size of the substrate 38 that will be processed.

Circulation of the plating solution 31 mixes the plating solution 31 and aids in the replenishment of the plating solution 31 adjacent to the surface of the substrate 38. In order to maintain circulation (represented the curved arrows 63) within the electroplating cell 42, the electroplating cell 42 may additionally have an overflow reservoir 56. The overflow reservoir 56 is positioned to receive the plating solution 31 after the plating solution 31 has entered the electroplating cell 42 (e.g., through an entry port 107 at the bottom of the electroplating cell 42) and has circulated through the electroplating cell 42 before entering the overflow reservoir 56. As such, the overflow reservoir 56 may be a weir located adjacent to a top of the electroplating cell 42 so that plating solution 31 can enter the bottom of the electroplating cell 42, circulate around the electroplating cell 42, and make its way up through the electroplating cell 42 before flowing over a side of the electroplating cell 42 and entering the overflow reservoir 56.

The overflow reservoir 56 is connected to the recirculation line 55. The recirculation line 55 receives the plating solution 31 from the overflow reservoir 56 and recirculates the plating solution 31 from the overflow reservoir 56 back to the electroplating cell 42. The recirculation line 55 has a first pump 109 that is utilized to pump the plating solution 31 back into the electroplating cell 42 through, e.g., the entry port 107. The first pump 109 also aids in the mixing of the plating solution 31 within the electroplating cell 42.

The recirculation line 55 may also include a filter 111. The filter 111 is used to remove particulates and other impurities from the plating solution 31 as the plating solution 31 recirculates within the processing system 400. These impurities may include silicate, aggregated surfactant, oil drop by-products of the plating solution 31, and other particles that may form during the processing reactions or else otherwise be in the plating solution 31. The filter 111 size may be dependent at least on the size of the silicates, aggregated surfactant, and the oil drop by-product impurities The recirculation line 55, first pump 109, and filter 111 provides a desired recirculation rate of the plating solution 31 to the electroplating cell 42. This recirculation rate may be used to ensure that the plating solution 31 is properly mixed so that concentration variations (that result from the chemical reactions) at different points within the plating solution 31 are kept at a minimum.

As the process continues, the reactants within the plating solution 31 (e.g., the strong base, the surfactant, and the oxidant) will react and their concentrations will reduce while concentrations of by-products of the reactions (such as silicates) will increase, thereby changing the various rates of reaction and introducing undesired complexity in controlling the processing process. In order to reduce the effects of this reduction, a replenishment system 120 is utilized to monitor the concentrations of the individual components and, if necessary, to replenish the individual components within the plating solution 31 in order to maintain better control over the process. In an embodiment, the replenishment system 120 includes a monitoring system 121 and a controller 500.

The monitoring system 121 is connected to the recirculation line 55 with a bypass line 125 connected between the first pump 109 and the filter 111. To obtain samples of the plating solution 31, a first valve 127 is installed in the bypass line 125 and utilized to remove samples of the plating solution 31 from the recirculation line 55 for analysis. The first valve 127 receives a signal from the controller 500 to open and take a sample at regular intervals.

A cooler 129, e.g., a continuous flow heat exchanger with a cooling medium such as cooling water, is located downstream of the first valve 127 to provide a constant temperature of the samples of the plating solution 31. In some embodiments, the cooler 129 is an active cooling unit, e.g., a refrigeration unit to provide the desired cooling to the samples of the plating solution 31. Any suitable system and method of reducing the temperature of the sample of the plating solution 31 and maintaining the temperature of the samples of the plating solution 31 may be used without departing from the scope of the embodiments.

Once the samples of the plating solution 31 have been cooled down to the appropriate temperature, the samples of the plating solution 31 can be analyzed by a measurement unit 131. The measurement unit 131 includes one or more analysis units, with each of the analysis units utilized to measure one or more components of the plating solution 31. For example, a first analysis unit 117 may analyze the concentration of the oxidant, a second analysis unit 119 may analyze a concentration of the surfactant, and a third analysis unit 151 may analyze a concentration of the strong base.

In some embodiments, the first analysis unit 117 used to measure the oxidant concentration in the samples of the plating solution 31 further includes multiple measuring units, with each one of the individual different measuring units measuring different ranges of concentrations of the oxidant. For example, for measuring higher concentrations of the oxidant, the first analysis unit 117 includes an intensity unit 153 that measures, e.g., an oxidation-reduction potential (ORP) of the samples of the plating solution 31. In some embodiments, the intensity unit 153 is a pH measurement unit, which measures the pH of the samples of the plating solution 31. Either type of intensity unit 153 (e.g., that measures either ORP or pH) and any other suitable type of measuring unit that provides a suitable concentration of the oxidant within the plating solution 31 is utilized, and all such types are fully intended to be included within the scope of the embodiments.

In addition, for measurements that are desired below the sensitivity levels of the intensity unit 153 (e.g., below 100 ppm), the first analyzer 117 also includes a spectrum analyzer 155. In some embodiments, the spectrum analyzer 155 is an optical spectrum analyzer, in which the sample of the plating solution 31 is irradiated with ultraviolet (UV) light, near-infrared (NIR) light, or infrared (IR) light, and a resulting absorption spectrum is analyzed to determine the concentration of the oxidant within the samples of the plating solution 31.

In some embodiments, the spectrum analyzer 155 measures the concentration of other components that are within the plating solution 31. For example, the spectrum analyzer 155 measures the concentration of reaction by-products, such as silicate in the plating solution 31. This and any other analysis for which the spectrum analyzer 155 is suitable are also utilized to provide information on the plating solution 31.

In some embodiments, a second analyzer 119 measures the concentration of the surfactant within the samples of the plating solution 31. The second analyzer 119 is a spectrum analyzer, such as an optical spectrum analyzer, in which the samples of the plating solution 31 are irradiated with, e.g., ultraviolet (UV) light and a resulting absorption spectrum is analyzed to determine the concentration of the surfactant within the samples of the plating solution 31. In some embodiments, the second analyzer 119 is the spectrum analyzer 155 as described above with respect to the first analyzer 117, although the second analyzer 119 may have a separate spectrum analyzer. Any suitable analyzer may alternatively be utilized to measure the concentration of the surfactant within the samples of the plating solution 31, in some embodiments.

The third analyzer 151 measures the concentration of the strong base within the samples of the plating solution 31. In some embodiments when the strong base is KOH, the third analyzer unit 151 is a pH meter to determine the concentration of KOH in the plating solution 31. However, any other suitable measurement system, such as a refractometer, may alternatively be utilized to measure the concentration of the strong base within the plating solution 31.

Figure 3:
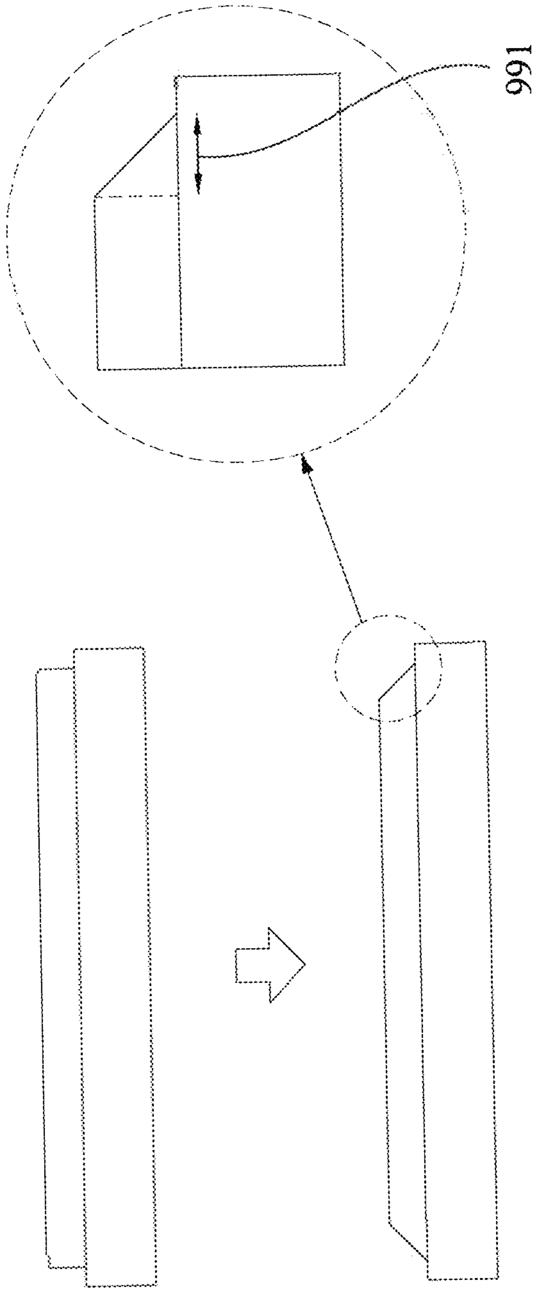
FIG. 3 is a schematic view of a simplified edge bevel removal process including a tap width according to some embodiments of the disclosure.

As shown in FIG. 3, the edge bevel is a layer of plated material that builds up at the edge of the wafer during the electroplating process. The extra metal film at the edge of the wafer may cause process arcing, induces defect and reduces device yield at following process, such as etch process, or peeling off of the plated metal film. Undesirable metal particles generated by the peeled-off metal film can interfere with the further processing steps, and therefore it is beneficial to remove it as a part of the electroplating process.

As an example, in a copper damascene process, the formation of the desired conductive traces/routes begins with a thin physical vapor deposition (PVD) of the metal, followed by a thicker electrofill layer, which is formed by electroplating. The PVD process is typically sputtering. In order to maximize the size of the wafer's useable area ("active surface region") and to maximize the number of integrated circuits produced per wafer, the electrofilled metal must be deposited to the very edge of the semiconductor wafer. Thus, it is necessary to allow physical vapor deposition of the metal over the entire front side of the wafer. As a byproduct of this process step, PVD metal coats the front edge area outside the active circuit region.

The PVD metal remaining on the wafer edge after electrofill is undesirable for various reasons. For example, the PVD metal on the wafer edge is not suitable for subsequent depositions and tends to flake off generating undesirable metal particles. To address these problems, the electroplating process includes etching of the unwanted residual metal layers. Edge bevel removal (EBR) requires a relatively long processing time. In order to realize throughput gain, it is highly desirable to reduce the duration of all non-plating processes, such as EBR. It is also desirable to minimize losses of electrofilled metal in the active area of the wafer while removing the surrounding bevel, to reduce a tap width 991. The tap width 991 is the width of the tapered portion of the deposited metal (see FIG. 3).

Figure 4A:
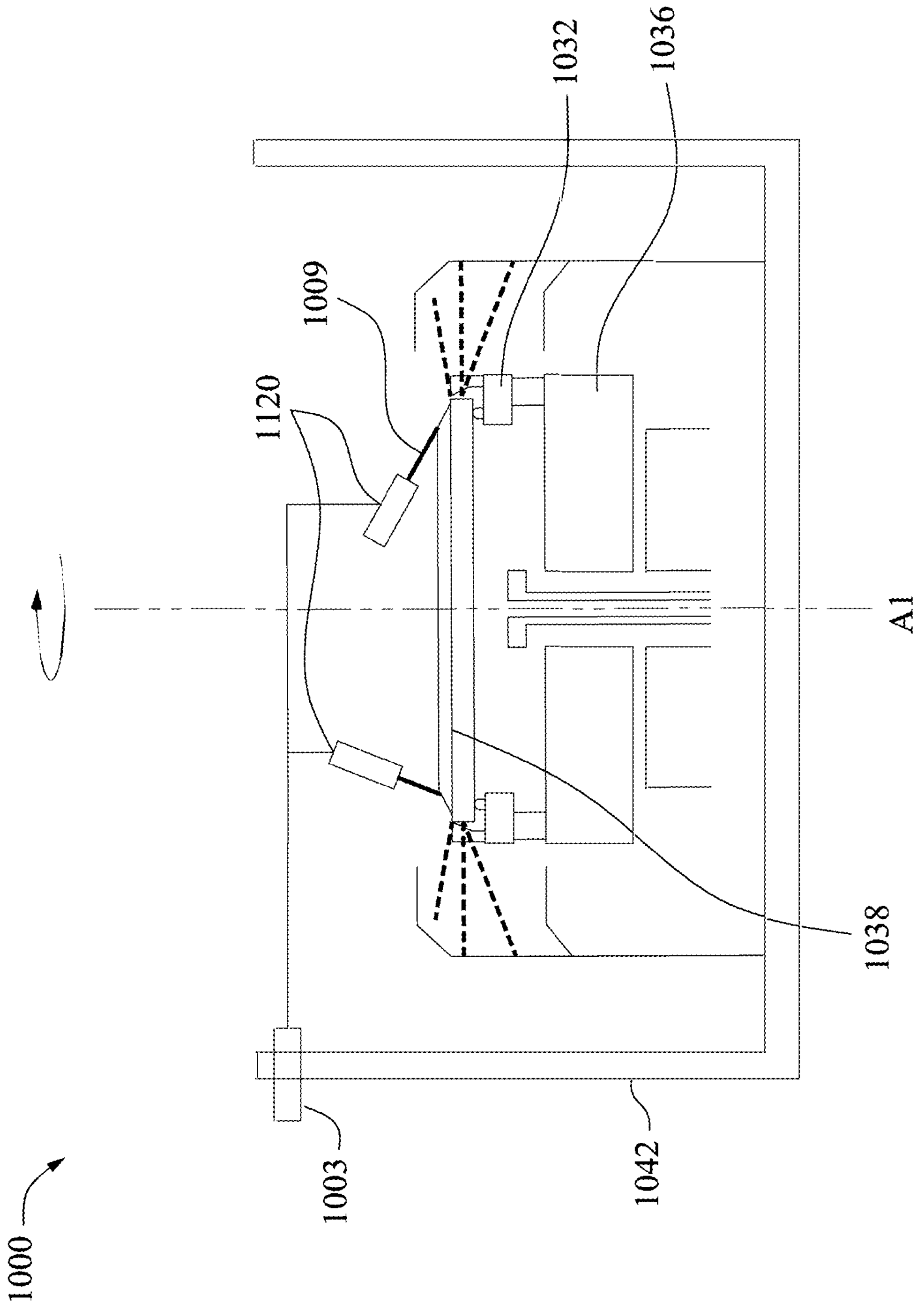
FIG. 4A shows a schematic view of an edge bevel removing cell according to an embodiment of the present disclosure.

FIG. 4A shows a schematic view of an edge bevel removing system 1000 according to an embodiment of the present disclosure. The edge bevel removing system 1000 includes a cell chamber including an edge bevel removing cell 1042 and a substrate holder 1032 mounted on a wafer chuck 1036 which allows rotation of the substrate holder 1032. Before the edge bevel removal process starts, a substrate 1038 is mounted on the wafer chuck 1036. Then, the substrate holder 1032 and the substrate 1038 are rotated by the wafer chuck 1036 within the edge bevel removing cell 1042.

The substrate 1038 is positioned in the edge bevel removing cell 1042 facing up towards the two or more nozzles 1120. The substrate 1038 is rotated about a cylindrical center axis A1 during the edge bevel removal (EBR) process. An EBR solution 1009 flows into the two or more nozzles 1120 through a cleaning solution inlet 1003 of the edge bevel removing cell during the edge bevel removal process. In some embodiments, the EBR solution 1009 is configured to flow from the two or more nozzles 1120, and then routed out of the edge bevel removing cell.

Figure 4B:
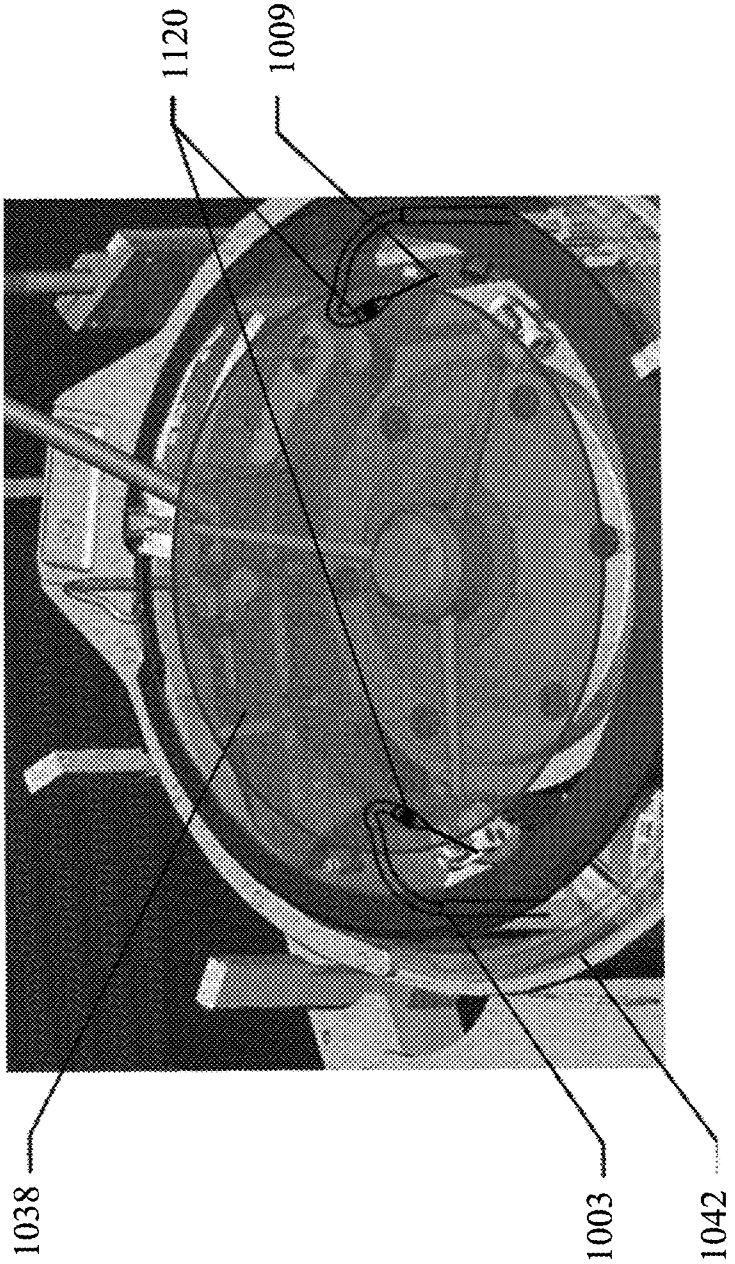
FIG. 4B shows an isometric view of the two or more nozzles of the edge bevel removing cell according to an embodiment of the present disclosure.

FIG. 4B shows an isometric view of the two or more nozzles 1120 connected to the cleaning solution inlet 1003 of the edge bevel removing cell 1042. As shown in FIG. 4B, the EBR solution 1009 is provided from the cleaning solution inlet 1003 of the edge bevel removing cell 1042 and directed at the substrate 1038 by a jet of the EBR solution 1009.

Figures 5A, 5B, 5C:
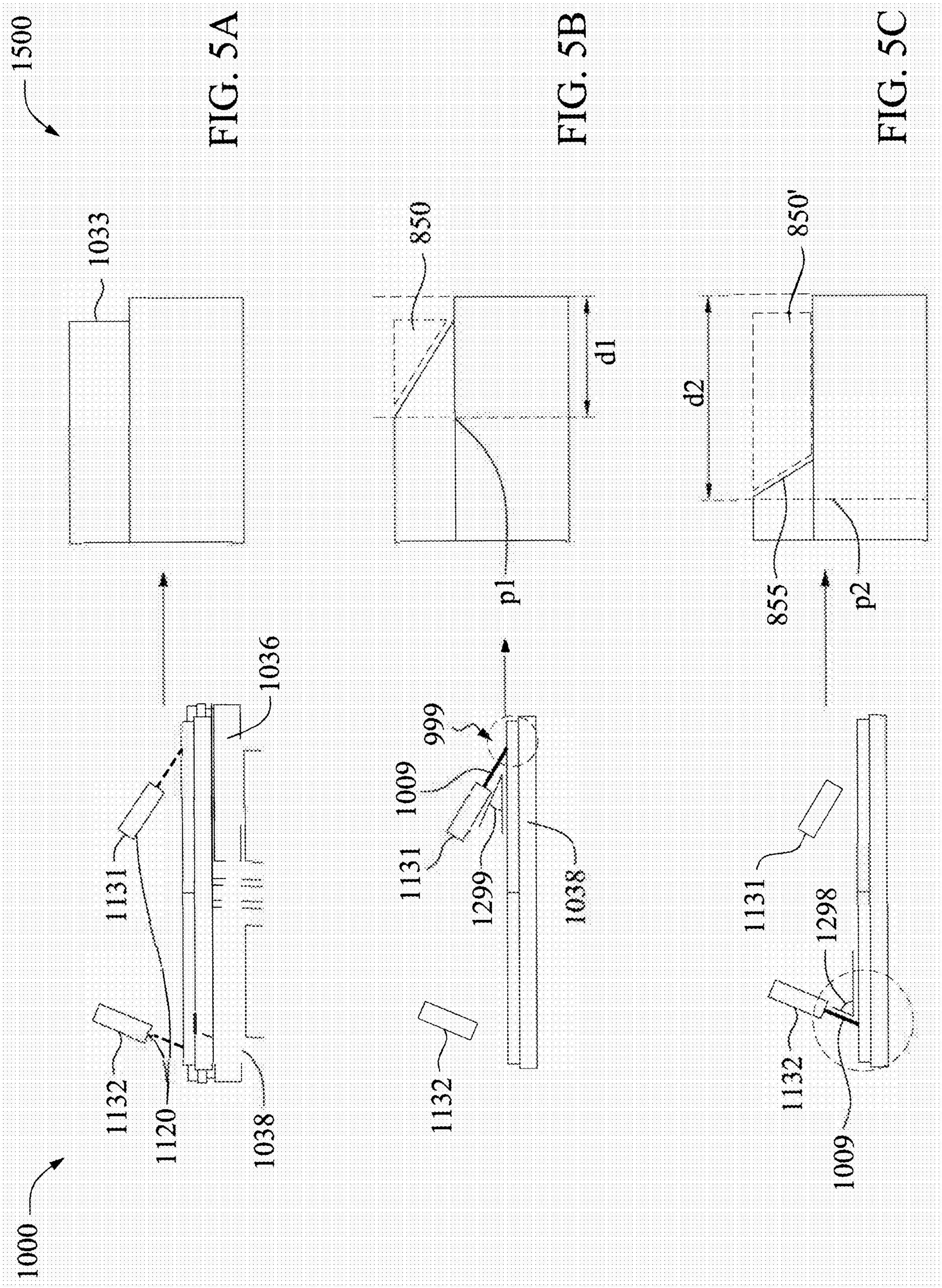
FIGS. 5A, 5B, 5C, 5D and 5E show schematic views of the edge bevel removing process removing unwanted plated portions at the edge of the wafer.

As shown in FIGS. 5A, 5B, and 5C, the two or more nozzles 1120 eject the EBR solution 1009 onto an unwanted plated portion 850, 850' of the plated metal film 1033, while the wafer chuck 1036 rotates the substrate 1038. As shown in FIGS. 5B and 5C, the unwanted plated portion 850, 850' at an edge 999 of the substrate 1038 is removed by the EBR solution 1009 and centrifugal force due to the rotation of the substrate 1038. Therefore, the EBR solution 1009 sprayed by the two or more nozzles 1120 removes the unwanted plated portion 850, 850' at the edge 999 of the substrate 1038 forming a tapered portion 855 by etching the edge of the plated metal film 1033.

In some embodiments, the edge bevel removing system 1000 is configured to perform an automatic-EBR operation 1500 to remove the unwanted plated portion 850. In such embodiments, the automatic-EBR operation 1500 includes configurable parameters, including one or more of a type of fluids, spin speed, flow rate, pressure, temperature, nozzle distance from the edge of the wafer, and an incidence angle 1299, 1298 between the ejecting direction of the EBR solution 1009 and the surface of the wafer, etc.

As shown in FIGS. 5A 5B, and 5C, in the automatic-EBR operation 1500, a first incidence angle 1299 (as shown in FIG. 5B) and a second incident angle 1298 (as shown in FIG. 5C) of the EBR solution 1009 between the two or more nozzles 1120 and the substrate 1038 are different from each other and set in a range of between about 30 degrees to about 80 degrees. However, any appropriate number of nozzles and/or configuration regarding the angles of the two or more nozzles is contemplated and is not limited in this regard.

Referring back to FIGS. 5B and 5C, in certain embodiments, a first nozzle 1131 of the two or more nozzles 1120 is set with a first incidence angle 1299 of the EBR solution 1009 between about 30 degrees and about 60 degrees, and a second nozzle 1132 of the two or more nozzles 1120 is set with a second incidence angle 1298 between about 60 degrees and about 80 degrees. In some embodiments, the first incident angle 1299 is smaller than the second incident angle 1298. In some embodiments, a sequential operation by the two or more nozzles 1120 ejecting the EBR solution 1009 results in synergic results. For example, the first nozzle 1131 (outer nozzle) only removes the outer film, while second nozzle 1132 (inner nozzle) removes the inner and outer films. As a result, when removing the unwanted plated portion 850, 850' of the plated metal film 1033, the final tap width is decided by the second nozzle 1132 (inner nozzle), thereby increasing the throughput of the EBR process. In alternative embodiments, a simultaneous operation by the two or more nozzles 1120 ejecting the EBR solution 1009 results in synergic results when removing the unwanted plated portion 850, 850' of the plated metal film 1033.

Figure 6:
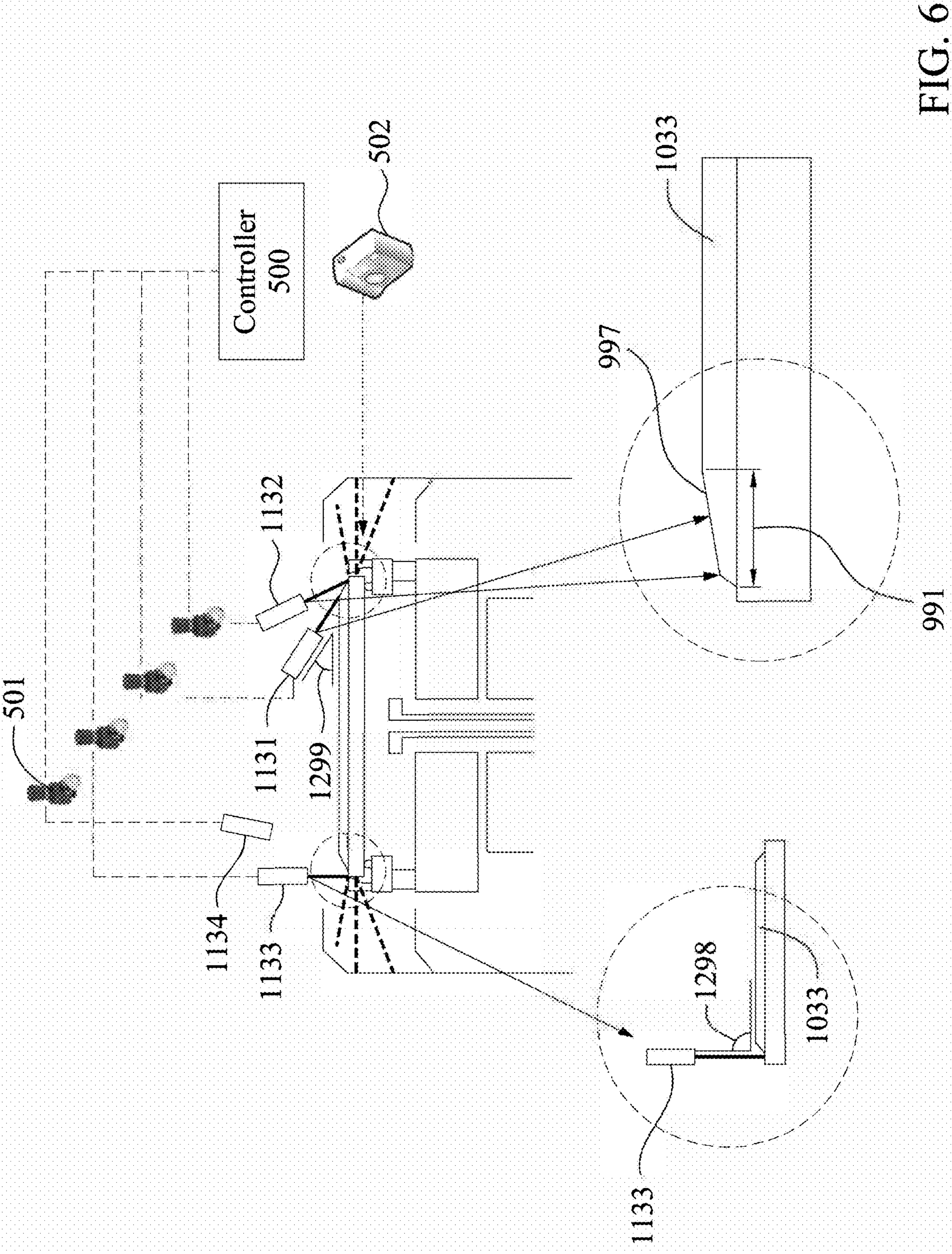
FIG. 6 shows a schematic view of the two or more nozzles adjusting the tap width and edge profile of the plated metal film.

As shown in FIG. 6, in some embodiments, the EBR solution 1009 ejected by the first nozzle 1131 of the two or more nozzles 1120 is the same material as the EBR solution 1009 ejected by the second nozzle 1132 of the two or more nozzles 1120. In alternative embodiments, the EBR solution 1009 ejected by the first nozzle 1131 of the two or more nozzles 1120 is different material than the EBR solution 1009 ejected by the second nozzle 1132 of the two or more nozzles 1120. In certain embodiments, a third nozzle 1133 (as shown in FIG. 6) of the two or more nozzles 1120 is set with a third incidence angle 1297 of the EBR solution 1009 between about 80 degrees and about 90 degrees. In alternative embodiments, the third nozzle 1133 of the two or more nozzles 1120 is set with a third incidence angle 1297 of the EBR solution 1009 other than about 90 degrees. In some embodiments, third nozzle 1133 (as shown in FIG. 6) of the two or more nozzles 1120 is configured to clean the edge of the wafer where there is no plated metal film 1033. By using the first, second and third nozzles 1131, 1132, 1133, the edge bevel removing system 1000 is configured to generate a desired edge profile 997 of the plated metal film 1033. In some embodiments, a fourth nozzle 1134 ejects a rinsing solution that is different from EBR solution ejected by the other nozzles.

In some embodiments, as shown in FIG. 5B, lengths d1, d2 of the edge bevel to be removed by the EBR solution 1009 from the two or more nozzles 1120 ranges from about 0.1 mm to about 3 mm. In some embodiments, as shown in FIG. 5B, the first nozzle 1131 of the two or more nozzles 1120 is configured to eject the EBR solution 1009 onto the surface of the wafer at an incident point p1 of the surface of the wafer, thereby removing a first length d1 of the edge bevel between the incident point p1 and the edge of the wafer. In some embodiments, d1 is about 0.1 mm to about 2 mm. As shown in FIG. 5C, the second nozzle 1132 of the two or more nozzles 1120 is configured to eject the EBR solution 1009 onto the surface of the wafer at an incident point p2 of the surface of the wafer, thereby removing a second length d2 of the edge bevel between the incident point p2 and the edge of the wafer. In some embodiments, the second length d2 is about 1 mm to about 3 mm. In some embodiments, the second length d2 is greater than the first length d1.

During the automatic-EBR operation 1500, the two or more nozzles 1120 ejects the EBR solution 1009 at a flow rate between about 0.2 ml/sec to about 0.3 ml/sec. In certain embodiments, the two or more nozzles 1120 eject the EBR solution 1009 at a flow rate of about 0.23 ml/sec. In some embodiments, the EBR solution 1009 includes sulfuric acid ($H_2SO_4$), hydrogen peroxide ($H_2O_2$) or any appropriate etching solutions for a Cu layer.

In some embodiments, a controller 500 (see FIG. 6) is used to control the tap width 991 and edge profile 997 of the plated metal film 1033. The controller 500 is configured to control the flow regulator 501 (see FIG. 6) such that the deposited film has a desired tap widths 991 and edge profile 997 of the plated metal film 1033.

Controlling the tap width 991 and the edge profile 997 of the plated metal film 1033 by the two or more nozzles 1120 to be within desired ranges increase the reliability of the deposited film by the EBR solution 1009. Accordingly, it is preferable to maintain the tap width 991 and the edge profile 997 within acceptable ranges to maintain reliability of the electrochemical plating. In some embodiments disclosed in the present application, the controller 500 controls the removal of the edge profile 997 to provide a pre-determined tap width 991 on the plated metal film 1033.

Figure 5D:
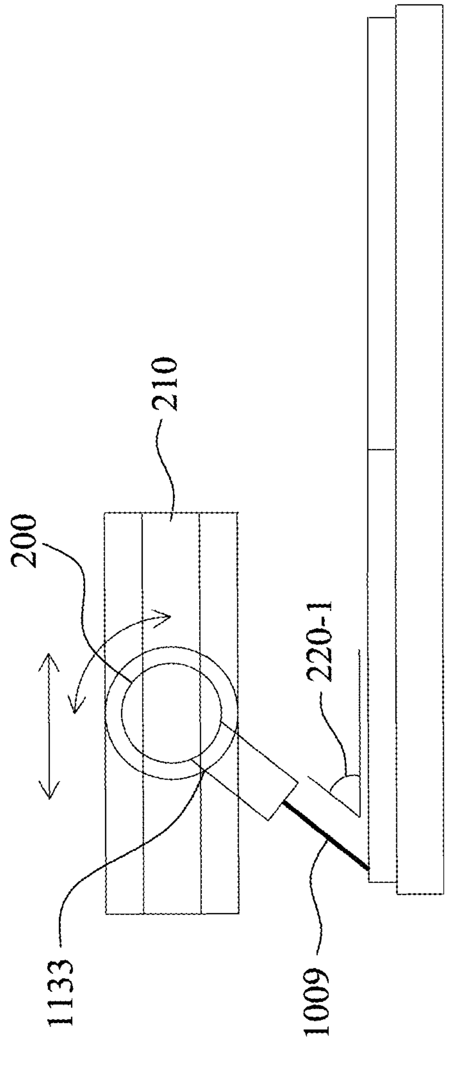
Figure 5E:
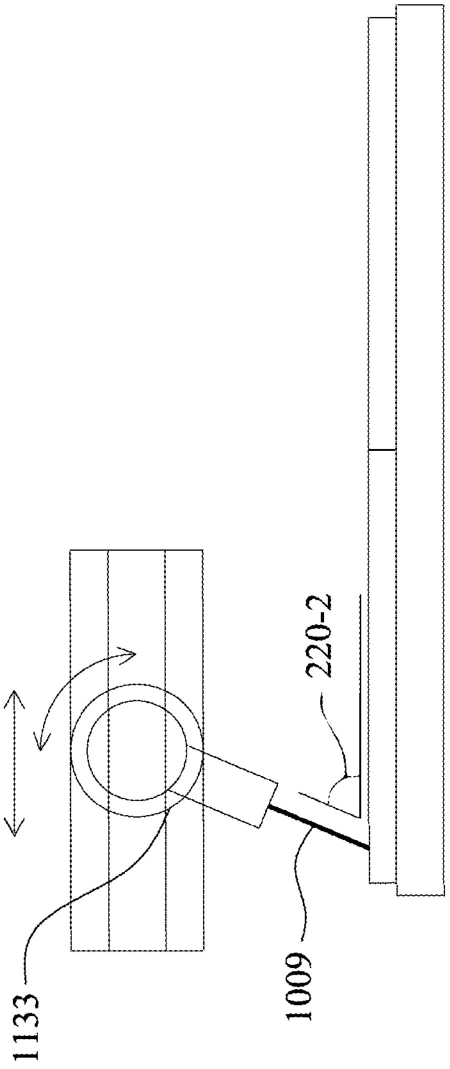

In some embodiments, a movable and rotatable nozzle as shown in FIGS. 5D and 5E is employed. In a first step of the EBR process, the nozzle 1133 is set to have a first incident angle 220-1 and first incident point. In some embodiments, the first incident angle 220-1 is between about 30 degrees and about 60 degrees and the first incident point of EBR solution 1009 is set at about 0.1 mm to 2 mm from the edge of the wafer. After a part of the plated metal film 1033 is removed by the first step, a second EBR process is performed. In the second EBR process, the nozzle 1133 is set to have the second incident angle 220-2 and a second incident point. In some embodiments, the second incident angle 220-2 is greater than the first incident angle 220-1. In some embodiments, the second incident angle 220-2 is between about 60 degrees and about 80 degrees. In some embodiments, the second incident point is set a greater distance from the edge of the wafer. In some embodiments, the second incident point of the EBR solution 1009 is set at about 1 mm to 3 mm from the edge of the wafer. In some embodiments, the nozzle 1133 includes a rotational mechanism 200 and a linear movement mechanism 210 including one or more motors, gears, belts, or any other mechanism to adjust the angle and the position of the nozzle 1133. In some embodiment, a vision/monitoring camera 502 is configured to acquire a cross-sectional image along an axis of a wafer thickness, and determines the tap width of the deposited film.

Figure 7:
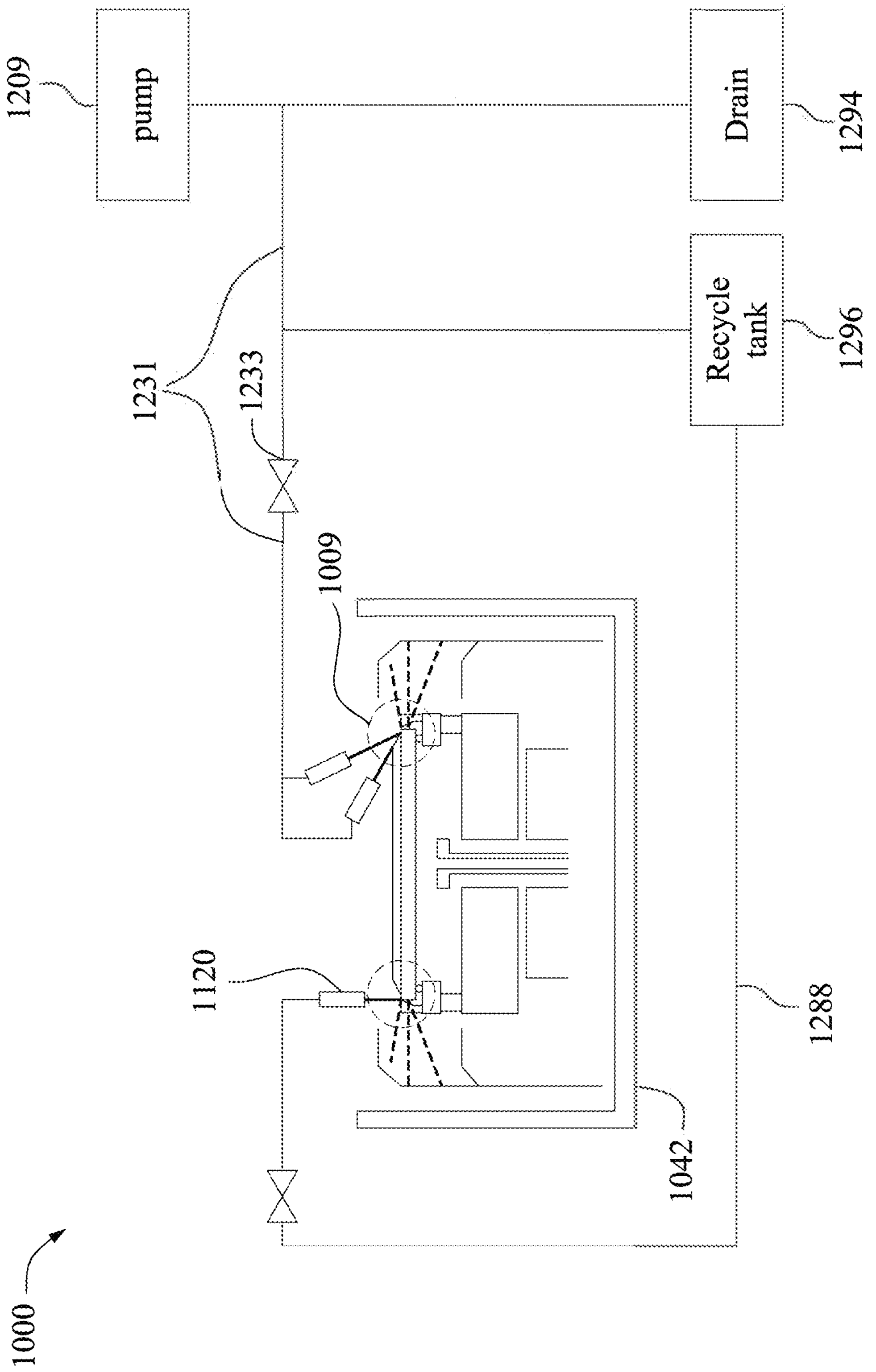
FIG. 7 shows a schematic view of the edge bevel removing cell including a tap-width control assembly according to an embodiment of the disclosure.

FIG. 7 shows a schematic view of the edge bevel removing system 1000 according to an embodiment of the present disclosure. As shown in FIG. 7, in some embodiments, each of the two or more nozzles 1120 are coupled with a control valve 1233 and a pump 1209 via a pipe 1231 to achieve a pre-determined tap width 991 of the plated metal film and to remove the unwanted plated portion 850 (shown in FIG. 5A) from the plated metal film located at the edge of the substrate. In some embodiments, the flow of the EBR solution 1009 through the flow regulators 501 is recirculated via a recirculation line 1288. In some embodiments, the EBR solution 1009 is stored in a recycle tank 1296 and supplied back to the edge bevel removing cell 1042. In some embodiments, the EBR solution 1009 is directed to a drain 1294 after being used in the EBR process.

Figure 8:
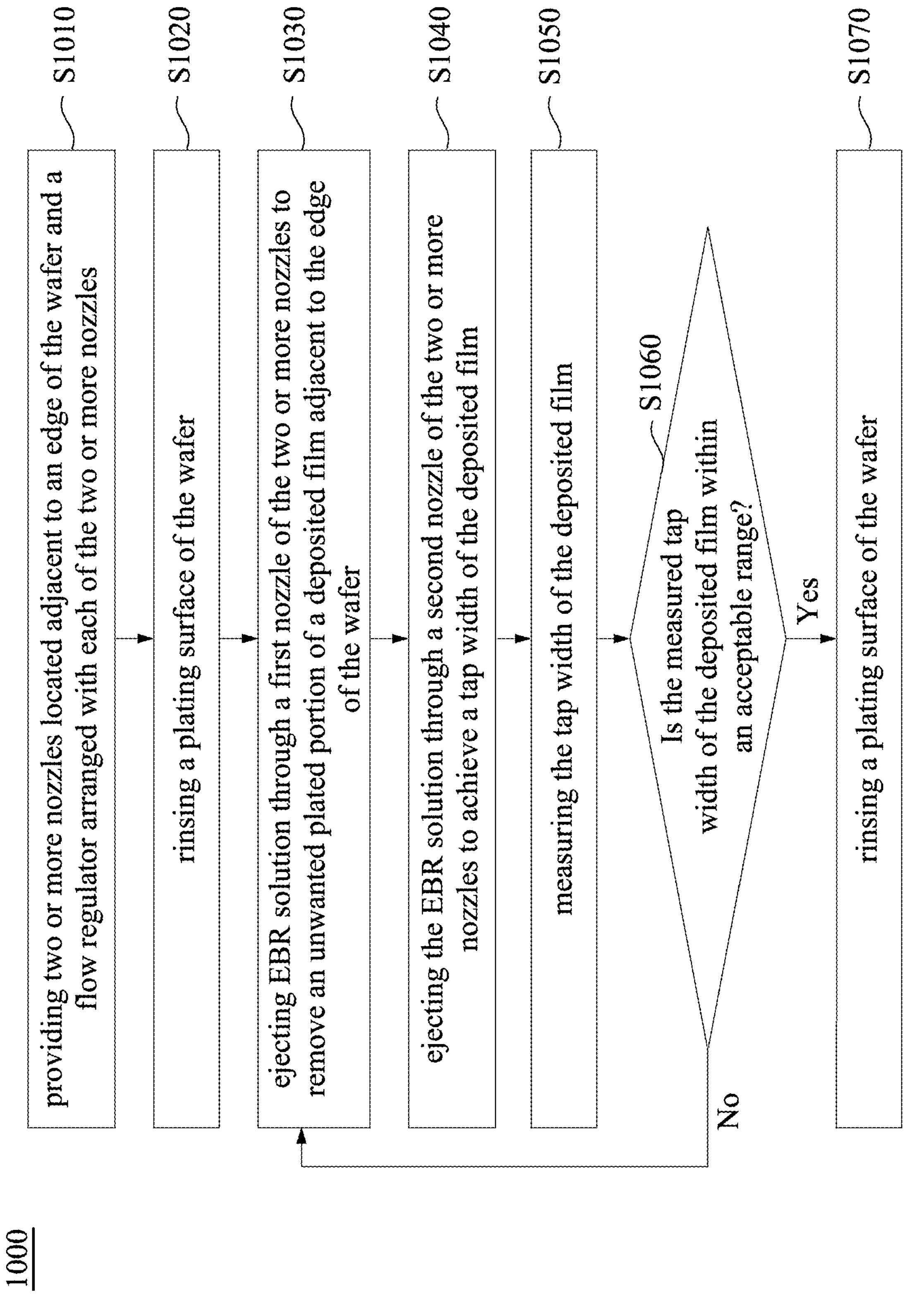
FIG. 8 illustrates a flow-chart of a method of controlling the edge bevel removing cell with a controller in accordance with an embodiment of the present disclosure.

FIG. 8 illustrates a flow-chart of a method 1000 of controlling the edge bevel removing system 1000 with the controller of an electrochemical plating apparatus in accordance with an embodiment of the present disclosure. The method includes, at S1010, providing two or more nozzles located adjacent to an edge of the wafer and a flow regulator arranged with each of the two or more nozzles. Then, at S1020, a plating surface of the wafer is rinsed. In some embodiments, pre- and post-rinse clean the surface of the wafer by a second nozzle, which is different from a first nozzle configured to remove the unwanted plated portion 850 (shown in FIG. 5A) of a deposited film. In some embodiments, the two or more nozzles further eject a rinsing solution by the fourth nozzle (shown in FIG. 6) different from the two or more nozzles ejecting the EBR solution. In some embodiments, the rinsing solution is $H_2O$ to clean surface of the wafer. At S1030, the cleaning solution is ejected through a first nozzle to remove the unwanted plated portion of a deposited film, which is adjacent to the edge of the wafer. At S1040, the cleaning solution ejected through a second nozzle of the two or more nozzles to achieve tap width of the deposited film. Then, the method includes, at S1050, measuring the tap width of the deposited film. In some embodiment, the vision/monitoring camera (shown in FIG. 6) is configured to acquire a cross-sectional image along an axis of a wafer thickness, and calculates the tap width of the deposited film. However, any appropriate pixel resolution and/or configuration regarding the image taken by of the vision/monitoring camera is contemplated and is not limited in this regard.

At S1060, a controller determines whether the measured tap width of the deposited film is within an acceptable length range. Upon determination that the measured tap width of the deposited film is not within the acceptable length range, the method repeats ejecting the cleaning solution through the two or more nozzles until the tap width of the deposited film is within the acceptable length range. When the measured tap width of the deposited film is within the acceptable range, at S1070, the method finishes an edge bevel removal process by rinsing the plating surface of the wafer.

Figure 9A:
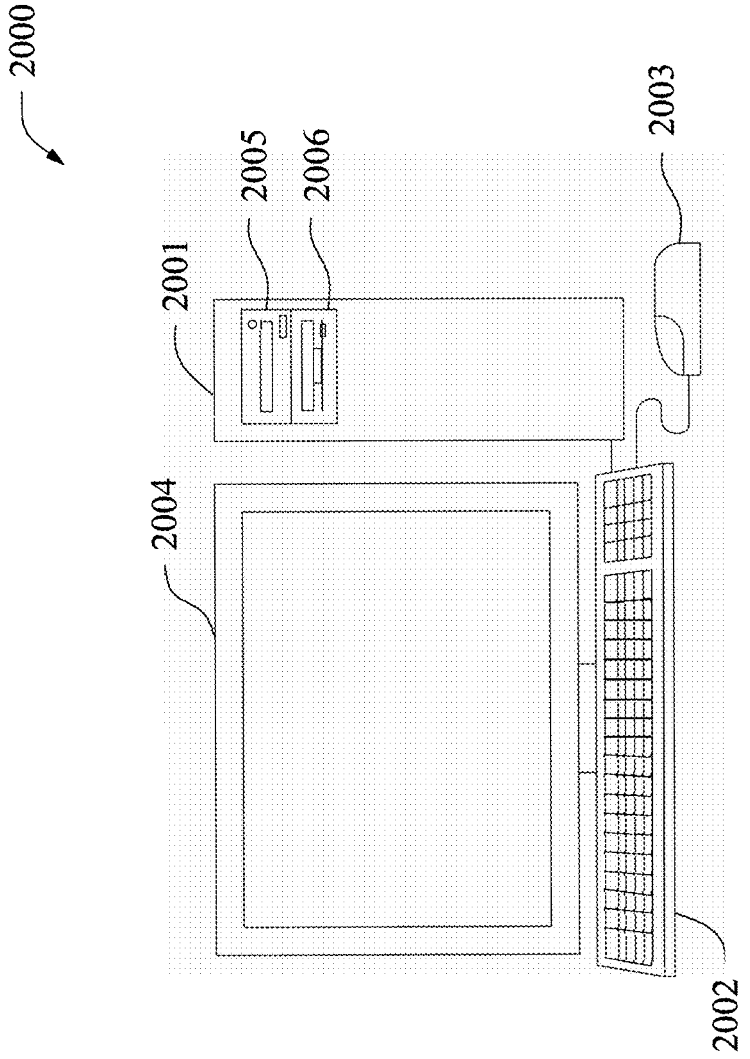
FIGS. 9A and 9B illustrate a controller in accordance with some embodiments of the disclosure.
Figure 9B:
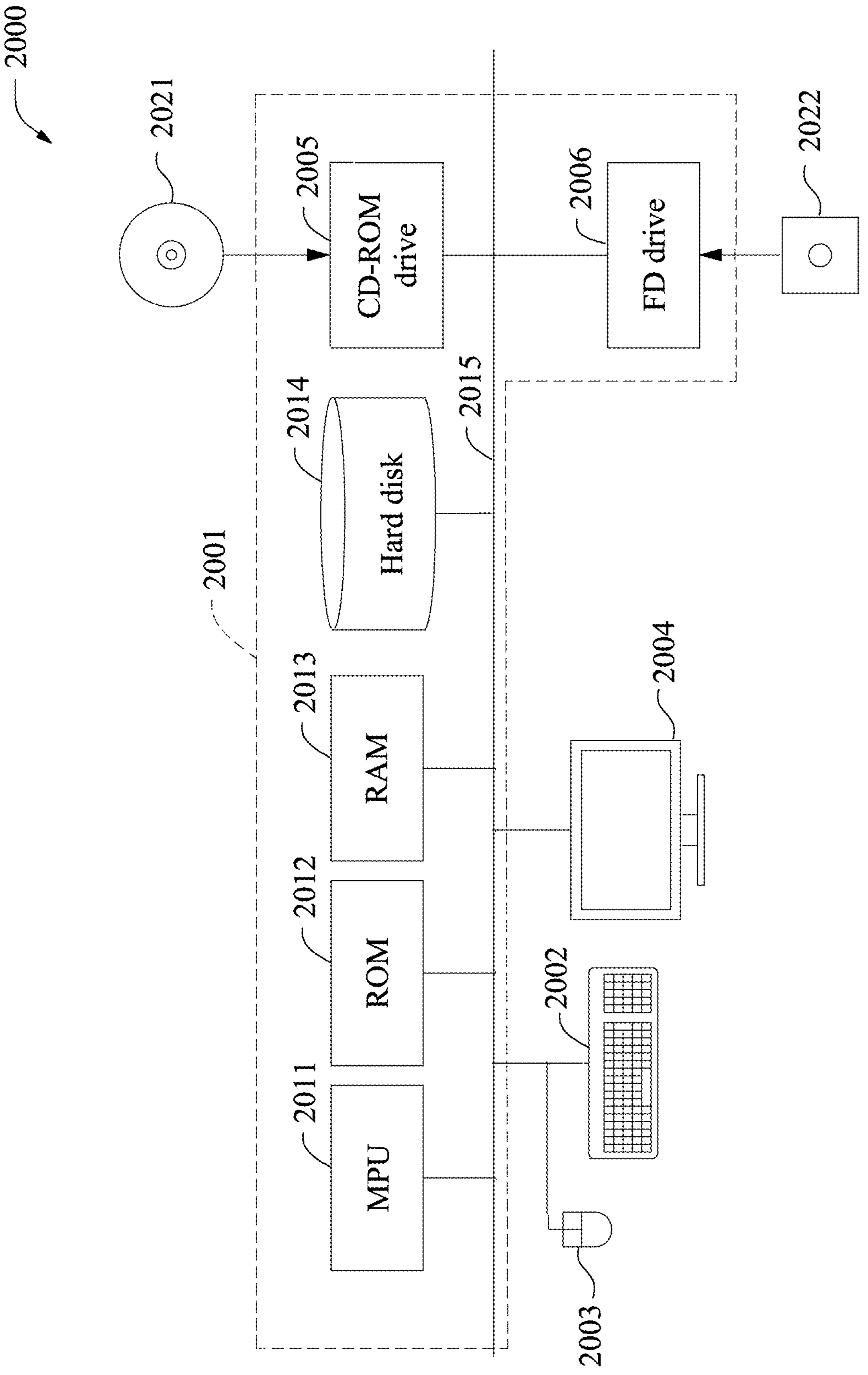

FIGS. 9A and 9B illustrate a configuration of the controller 500 in accordance with some embodiments of the disclosure. In some embodiments, a computer system 2000 is used as the controller 500. In some embodiments, the computer system 2000 performs the functions of the controller as set forth above.

FIG. 9A is a schematic view of a computer system. All of or a part of the processes, method and/or operations of the foregoing embodiments can be realized using computer hardware and computer programs executed thereon. In FIG. 9A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 9B is a diagram showing an internal configuration of the computer system 2000. In FIG. 9B, the computer 2001 is provided with, in addition to the optical disk drive 2005 and the magnetic disk drive 2006, two or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 500 in the foregoing embodiments. The program may only include a command portion to call an appropriate function (module) in a controlled mode and obtain desired results.

In various embodiments, two or more flow regulators are provided in the cell chamber to remove an unwanted plated portion located in the edge of the substrate so as to provide a desired tap width. Such tap widths prevent uneven electrochemical plating on the wafer, thereby increasing the yield of the wafers and increasing the throughput of the chemical process system as well as reducing the cost of maintenance of the semiconductor manufacturing process lines.

An embodiment of the disclosure is an apparatus. The apparatus includes a wafer holder and two or more nozzles. The wafer holder is configured to hold a wafer on which a conductive layer is formed, and to rotate the wafer. The two or more nozzles are configured to eject an edge bevel removal (EBR) solution to remove a portion of the conductive layer. A first nozzle and a second nozzle of the two or more nozzles are configured to eject the EBR solution to contact points at an edge region of the wafer different from each other at incident angles different from each other.

In some embodiments, the first nozzle is configured to eject the EBR solution at an incident point and the second nozzle is configured to eject the EBR solution at an incident point, a first distance of the first nozzle between the incident point and an edge of the wafer is lower than a second distance of the second nozzle between the incident point and an edge of the wafer. In some embodiments, the first nozzle is configured to have a first incidence angle of the EBR solution and the second nozzle is configured to have a second incidence angle of the EBR solution, a first incidence angle of the first nozzle is lower than a second incidence angle of the second nozzle. In some embodiments, the two or more nozzles include a third nozzle configured to set a third incidence angle of the EBR solution, the third incidence angle of the third nozzle is greater than the first and second incidence angle. In some embodiments, the apparatus further includes a mechanism to adjust an angle and position of the two or more nozzles. In some embodiments, the two or more nozzles include a third nozzle configured to set a third incidence angle of the EBR solution of 80-90 degrees. In some embodiments, the apparatus further includes a vision camera configured to acquire a cross-sectional image along an axis of a wafer thickness. In some embodiments, the two or more nozzles include a fourth nozzle for ejecting a rinsing solution.

Another embodiment of the disclosure is a method. The method includes providing two or more nozzles located adjacent to an edge of a wafer on which a film is formed. First rinsing is performed on a surface of the film. Then, an edge bevel removal (EBR) solution is ejected through a first nozzle of the two or more nozzles to remove a first portion of the film adjacent to the edge of the wafer. Subsequently, the EBR solution is ejected through a second nozzle of the two or more nozzles to remove a second portion of the film adjacent to the edge of the wafer. Second rinsing is then performed on the surface of the film. A first incidence angle of the EBR solution from the first nozzle is different from a second incidence angle of the EBR solution from the second nozzle.

In some embodiments, the first incidence angle of the EBR solution is between 30 degrees and 60 degrees. In some embodiments, the second incidence angle of the EBR solution is greater than the first incident angle and is between 60 degrees and 80 degrees. In some embodiments, the EBR solution is at least one of sulfuric acid ($H_2SO_4$) or hydrogen peroxide ($H_2O_2$). In some embodiments, a rinsing solution in the first rinsing and the second rinsing is de-ionized water. In some embodiments, the tap width of the film is measured. Then, a controller determines whether the measured tap width of the film is greater than a pre-determined length. Upon determination that the measured tap width of the film is not greater than the pre-determined length, ejecting the EBR solution is repeated through the two or more nozzles until the tap width of the deposited film is equal to or less than the pre-determined length. In some embodiments, the first nozzle is configured to eject the EBR solution at an incident point wherein a first distance between the incident point and an edge of the wafer is 0.1 mm to 2 mm, and the second nozzle is configured to eject the EBR solution at an incident point wherein a second distance between the incident point and an edge of the wafer is 1 mm to 3 mm.

Another aspect of the present disclosure is an apparatus. The apparatus includes a wafer including a plated film and a tap-width control assembly including flow regulators communicating with two or more nozzles located adjacent to the edge of the wafer. The tap-width control assembly is configured to adjust a tap width of the plated film.

In some embodiments, the two or more nozzles are configured to further generate an edge profile of the plated film. In some embodiments, the apparatus further includes a mechanism to adjust an angle and position of the nozzle. In some embodiments, the two or more nozzles include a third nozzle configured to set a third incidence angle of an edge bevel removal (EBR) solution of 80-90 degrees. In some embodiments, the third nozzle is configured to clean the edge of the wafer where there is no plated metal film.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:

a wafer holder configured to hold a wafer on which a conductive layer is formed, and to rotate the wafer;

two or more nozzles disposed over an upper surface of the wafer holder and configured to eject an edge bevel removal (EBR) solution to remove a portion of the conductive layer;

a vision camera disposed to a side of the wafer holder and configured to acquire an image taken along a direction perpendicular to a side surface of the wafer holder which holds the wafer on which the conductive layer is formed on the wafer to determine a tap width of the conductive layer at an edge region of the wafer; and a controller communicatively coupled to the two or more nozzles and the vision camera, wherein the controller is configured to:

control a first nozzle and a second nozzle of the two or more nozzles to eject the EBR solution to contact points at an edge region of the wafer different from each other at incident angles different from each other;

receive, from the vision camera, a measurement of the tap width during rotation of the wafer; and adjust at least one of an incident angle and a contact point of the EBR solution from at least one of the first and second nozzles based on the measurement of the tap width to achieve a predetermined tap width.

2. The apparatus of claim 1, wherein:

the first nozzle is configured to eject the EBR solution at a first incident point, and the second nozzle is configured to eject the EBR solution at a second incident point, wherein a first distance of the first nozzle between the first incident point and an edge of the wafer is lower than a second distance of the second nozzle between the second incident point and the edge of the wafer.

3. The apparatus of claim 2, wherein:

the first nozzle is configured to have a first incidence angle of the EBR solution relative to the wafer, and the second nozzle is configured to have a second incidence angle of the EBR solution relative to the wafer, wherein the first incidence angle of the first nozzle is lower than the second incidence angle of the second nozzle.

4. The apparatus of claim 3, wherein the two or more nozzles include a third nozzle configured to set a third incidence angle of the EBR solution, the third incidence angle of the third nozzle is greater than the first and second incidence angles.

5. The apparatus of claim 4, further including a mechanism to adjust an angle and position of the two or more nozzles.

6. The apparatus of claim 1, wherein the two or more nozzles include a third nozzle configured to set a third incidence angle of the EBR solution at 80-90 degrees.

7. The apparatus of claim 4, wherein the two or more nozzles include a fourth nozzle for ejecting a rinsing solution.

8. An apparatus comprising:

a wafer holder configured to hold a wafer on which a plated film is formed, and to rotate the wafer;

two or more nozzles disposed over an upper surface of the wafer holder and configured to eject an edge bevel removal (EBR) solution to an edge region of the wafer to remove a part of the plated film on the edge region, wherein a plated film tap is formed on the edge region of the wafer;

a vision camera disposed to a side of the wafer holder and configured to acquire an image taken along a direction perpendicular to a side surface of the wafer holder which holds the wafer on which the plated film is formed on the wafer for determining a tap width of the plated film tap on the edge region of the wafer; and a controller communicatively coupled to the two or more nozzles and the vision camera, wherein the controller is configured to:

control a first nozzle and a second nozzle of the two or more nozzles to eject the EBR solution to contact points at an edge region of the wafer, different from each other, at incident angles different from each other;

receive, from the vision camera, a measurement of the tap width of the plated film tap at the edge region of the wafer during rotation of the wafer; and adjust at least one of an incident angle and a contact point of the EBR solution from at least one of the first and second nozzles based on the measurement of the tap width to achieve a predetermined tap width.

9. The apparatus of claim 8, wherein the two or more nozzles are configured to eject the EBR solution to two or more contact points different from each other at the edge region of the wafer.

10. The apparatus of claim 8, wherein a first nozzle of the two or more nozzles forms a first incidence angle of the EBR solution relative to the wafer, wherein a second nozzle of the two or more nozzles forms a second incidence angle of the EBR solution relative to the wafer, and wherein the first incidence angle is lower than the second incidence angle.

11. The apparatus of claim 10, wherein the first incidence angle is between 30 and 60 degrees, and wherein the second incidence angle is between 60 and 80 degrees.

12. The apparatus of claim 11, wherein the two or more nozzles further include a third nozzle forming a third incidence angle relative to the wafer in a range between 80 and 90 degrees.

13. The apparatus of claim 12, wherein the third nozzle is configured to clean the edge region of the wafer where there is no plated metal film.

14. An apparatus comprising:

a substrate holder configured to hold a substrate on which a metal layer is formed;

two or more nozzles disposed over an upper surface of the substrate holder and configured to eject an edge bevel removal (EBR) solution to remove a portion of the metal layer;

a vision camera disposed to a side of the substrate holder and configured to acquire an image taken along a direction perpendicular to a side surface of the substrate holder, which holds the substrate on which the metal layer is formed on the substrate for determining a tap width of the metal layer at an edge region of the substrate; and a processor communicatively coupled to the two or more nozzles and the vision camera, wherein the processor is configured to:

control a first nozzle and a second nozzle of the two or more nozzles to eject the EBR solution to contact points at the edge region of the substrate, different from each other, at incident angles different from each other;

receive, from the vision camera, a measurement of the tap width during rotation of the substrate; and adjust at least one of an incident angle and a contact point of the EBR solution from at least one of the first and second nozzles based on the measurement of the tap width of the metal layer to achieve a predetermined tap width of the metal layer.

15. The apparatus of claim 14, wherein:

the first nozzle is configured to eject the EBR solution at a first incident point, and the second nozzle is configured to eject the EBR solution at a second incident point, wherein a first distance of the first nozzle between the first incident point and an edge of the substrate is less than a second distance of the second nozzle between the second incident point and the edge of the substrate.

16. The apparatus of claim 15, wherein:

the first nozzle is configured to have a first incidence angle of the EBR solution relative to the substrate, and the second nozzle is configured to have a second incidence angle of the EBR solution relative to the substrate, wherein the first incidence angle of the first nozzle is less than the second incidence angle of the second nozzle.

17. The apparatus of claim 16, wherein the two or more nozzles include a third nozzle configured to set a third incidence angle of the EBR solution, the third incidence angle of the third nozzle is greater than the first and second incidence angles.

18. The apparatus of claim 14, wherein the two or more nozzles include a third nozzle configured to set a third incidence angle of the EBR solution at 80-90 degrees.

19. The apparatus of claim 1, further comprising:

flow regulators configured to control a flow of the EBR solution.

20. The apparatus of claim 8, further comprising:

flow regulators configured to control a flow of the EBR solution.

* * * * *